April 21, 1970 J. A. WENGER 3,507,756

METHOD OF FABRICATING SEMICONDUCTOR DEVICE CONTACT

Filed Aug. 4, 1967 2 Sheets-Sheet 1

INVENTOR
J. A. WENGER
BY H W Lockhart
ATTORNEY

April 21, 1970 J. A. WENGER 3,507,756

METHOD OF FABRICATING SEMICONDUCTOR DEVICE CONTACT

Filed Aug. 4, 1967 2 Sheets-Sheet 2

United States Patent Office 3,507,756
Patented Apr. 21, 1970

3,507,756

METHOD OF FABRICATING SEMICONDUCTOR DEVICE CONTACT

James A. Wenger, Spring Township, Berks County, Pa., assignor to Bell Telephone Laboratories, Incorporated, Murray Hill and Berkeley Heights, N.J., a corporation of New York Filed Aug. 4, 1967, Ser. No. 658,377
Int. Cl. C23b 5/50, 5/66
U.S. Cl. 204—15 6 Claims

ABSTRACT OF THE DISCLOSURE

In the fabrication of semiconductor devices of the beam lead type in which thick gold contacts and interconnections are formed by masked electroplating, improved definition is attained by providing a thin film of titanium-titanium oxide between the photoresist mask and the underlying metallic layer upon which the gold is being electroplated. The intervening titanium-titanium oxide film prevents underplating of the photoresist and alternatively the photoresist may be entirely removed prior to the plating operation and the titanium oxide utilized as the mask.

BACKGROUND OF THE INVENTION

Figure 1:
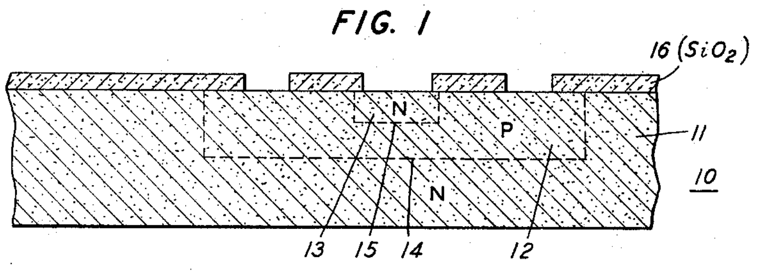

This invention relates to the fabrication of planar semiconductor devices and particularly to the electroplating of metallic contacts and interconnections selectively upon semiconductor bodies during such fabrication.

In accordance with the prior art, particularly as it relates to the fabrication of beam lead semiconductor devices in accordance with the teaching of M. P. Lepselter as disclosed, for example, in Patent 3,287,612, relatively heavy gold overlying contacts and interconnections are formed by masked electroplating on underlying thinner metallic contact layers. It is the usual practice to form such masks using well-known photoresist techniques. However, difficulties have been encountered in confining the gold plating precisely within the unmasked areas, inasmuch as the gold tends to plate beneath the edges of the photoresist pattern. This presents a substantial problem particularly in connection with transistors designed for operation at high frequencies where, generally, much closer electrode spacings are essential.

SUMMARY

In accordance with this invention improved masking and thus, more precise definition of the electroplated gold areas, is attained by depositing on top of the metallic layer, usually platinum, which ultimately underlies the gold overlayer, a thin film of titanium. This film is oxidized to form thereon a relatively tough film of titanium oxide upon which the photoresist pattern then is formed. Following formation of the photoresist pattern which delineates the areas over which gold is to be electroplated, the thus exposed titanium oxide and titanium are removed by a suitable etchant, exposing thereunder the platinum contact layer. The relatively heavy gold beam leads then are deposited upon the exposed platinum by electroplating with a resultant high degree of definition.

The invention and its objects and features will be more clearly understood from the following explanation taken in connection with the drawing in which FIGS. 1 through 7 depict, in cross section, a portion of a semiconductor slice, including a transistor configuration, as it is processed for the formation of contacts and interconnections in accordance with this invention.

Referring to FIG. 1 the body 10 represents, in cross section, a portion of a semiconductor slice from which an array of semiconductor devices are fabricated. By previous processing steps, using well-known masking and diffusion techniques, conductivity type zones 12 and 13 corresponding to base and emitter, respectively, have been made. A masking layer 16 of silicon oxide ($SiO_2$) is formed on the surface of the body to define contact areas for providing electrodes to the P type base region 12 and N type emitter region 13.

Figure 2:
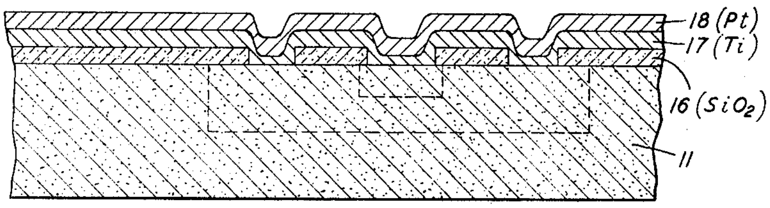

The contact structure described hereinafter, generally is in accordance with the teachings of Lepselter, as previously noted. Initially, as shown in FIG. 2, a layer of titanium is deposited on the entire surface of the body and particularly over the oxide film with which it forms an adherent bond. Advantageously, also in accordance with the teachings of Lepselter, prior to the deposition of titanium layer 17 a very thin film of platinum may be deposited and reacted with the exposed silicon surface to form platinum silicide, not shown.

Following the deposition of the titanium layer 17 a second metallic layer 18 of platinum is deposited over the entire surface. Next, referring to FIG. 3, and departing from the prior art practice according to which the photoresist pattern was formed on top of the platinum layer 18, a second layer 19 of titanium is deposited on top of the platinum. This layer may have a thickness of from 400 to 1000 A.

One useful method of depositing titanium has been by evaporation from a tungsten filament in vacuo. Other successful vacuum evaporation techniques may utilize an electron beam gun as the source of heat for the titanium charge.

Figure 3:
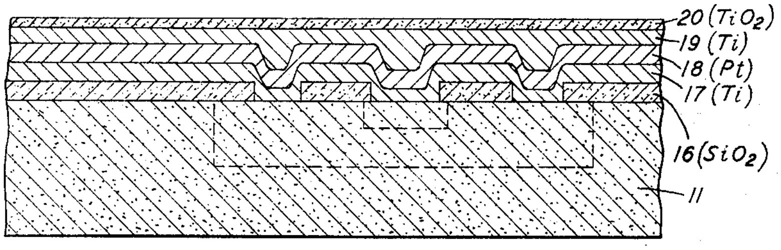
Figure 4:
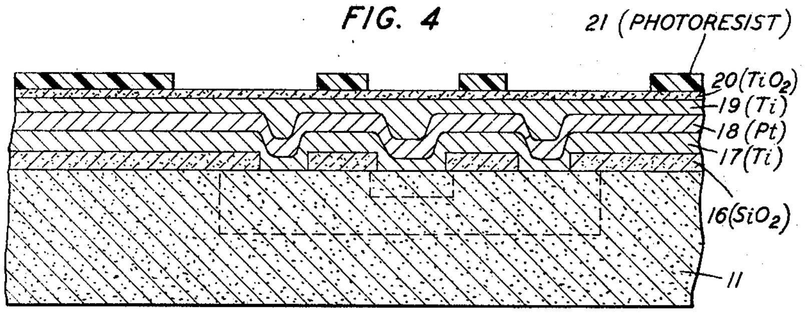

Following the evaporation of the metallic layers 17, 18 and 19, the semiconductor body 10 is removed from the vacuum deposition apparatus and prepared for the application of a photoresist mask. Also, as shown in FIG. 3, exposure of the body 10 to the atmosphere produces a thin film 20 of titanium oxide ($TiO_2$). Although this oxide film is relatively thin it is extremely tough and an excellent dielectric. Next referring to FIG. 4, the photoresist mask 21 is formed on the surface of the titanium-titanium oxide film 19–20. This mask 21 defines the extent of the final relatively thick metallic contacts, particularly of the type referred to as beam leads. It may be noted likewise in accordance with the teachings of Lepselter that the extent of these metallic contacts carries them over the vertical extensions of the intersection of the PN junctions 14 and 15 with the semiconductor body surface in order to assure passivation.

Figure 5:
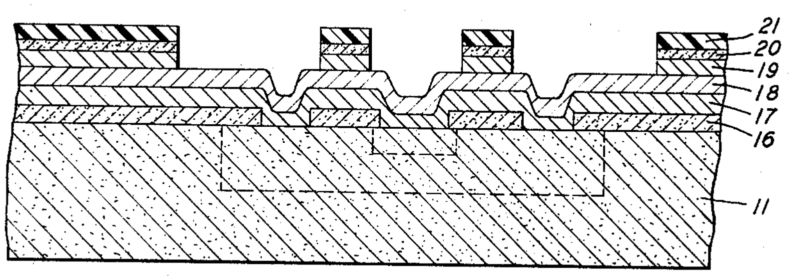

Referring to FIG. 5 the titanium-titanium oxide film 19–20 is removed in the unmasked areas by etching using the solution composed of sulphuric acid ($H_2SO_4$) and hydrofluoric acid (HF). One suitable mixture comprises 50 milliliters of water, 50 milliliters of sulfuric acid, and 1 milliliter of hydrofluoric acid.

Figure 6:
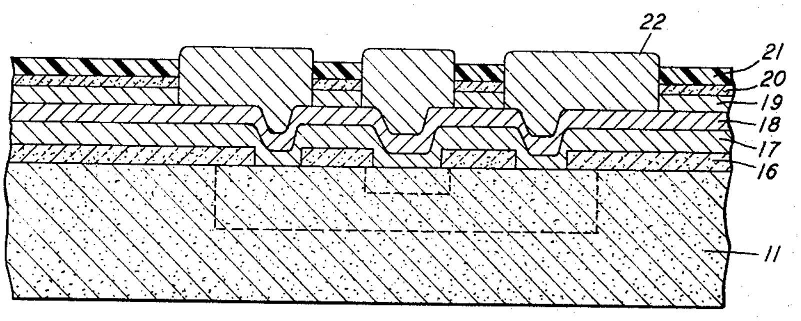

Next, as shown in FIG. 6 thick gold contacts 22 are formed by electroplating which occurs only in the unmasked portions atop the exposed areas of the platinum layer 18. These are relatively thick layers ranging up to 120,000 A. During this electroplating step, the presence of the titanium-titanium oxide film 19–20 substantially inhibits penetration of the deposited gold under the photoresist where it obviously would result in short circuits, particularly where extremely close-spaced electrodes are required, as in high frequency devices.

Alternatively, prior to the electrodeposition of gold the photoresist mask 21 may be removed and the titanium-titanium oxide film 19–20 performs equally advantageously as a mask for the gold electroplating. The exact reasons for the advantageous results obtained by the interposition of titanium-titanium oxide film for the electroplating operation have not been defined. However, whether from the standpoint of improved adhesion or for other reasons, sharply defined patterns of electroplated gold have been achieved enabling electrode spacing of the order of 0.10 micron.

It is also noteworthy that the titanium-titanium oxide layer provides an excellent mask for removal of the exposed platinum by chemical etching or by cathodic backsputtering. There may be alternative structures in which it is desirable to remove the platinum, for example, in order to electroplate gold directly on the underlying titanium.

Figure 7:
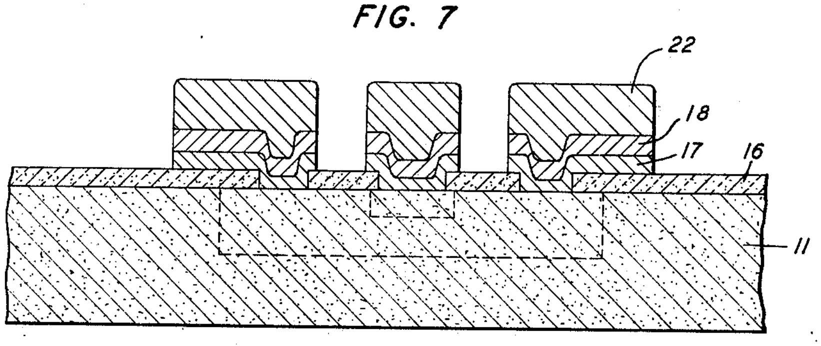

Finally, as depicted in FIG. 7, following the removal of the photoresist layer using a standard commercially available solvent, the unmasked layer of titanium oxide 20, titanium 19, platinum 18 and underlying titanium 17 are removed using selective etchants. As previously noted, a sulphuric acid-hydrofluoric acid etchant is used for the titanium film while a nitric acid-hydrochloric acid solution is used for the platinum layer. For the latter etchant, a solution of one part nitric acid to eight parts hydrochloric acid, by volume, mixed and held at a temperature of 50 degrees centigrade for about one hour produces excellent results. The semiconductor body 10 as finally depicted in FIG. 7, represents a portion of the slice with leads fabricated and ready for further processing including, for example, separation into individual devices, mounting and enclosure.

Although the invention has been disclosed in terms of a specific embodiment it will be understood that variations may be made by those skilled in the art which likewise fall within the scope and spirit of the invention.

What is claimed is:

1. In the method of fabricating semiconductor devices of the type having a relatively thick electrodeposited beam leads, the steps of interposing between the metallic layer upon which the electrodeposited layer is formed and a photoresist mask, a thin layer of titanium and titanium-oxide.

2. A method in accordance with claim 1 in which the underlying metallic layer is platinum.

3. The method in accordance with claim 2 in which the electrodepositing layer is gold.

4. The method in accordance with claim 1 in which the titanium-oxide layer is formed by exposure of the titanium film to an oxidizing atmosphere.

5. In the method of fabricating semiconductor devices of the beam lead type the steps including depositing a layer of platinum on a semiconductor body, depositing a layer of titanium over said platinum layer, oxiding at least a portion of said titanium layer to form a film of titanium oxide thereon, forming on said titanium oxide film a photoresist mask, removing unmasked areas of the titanium oxide and titanium layers and electrodepositing a relatively thick film of gold in said unmasked areas.

6. The method in accordance with claim 5 in which the removal of titanium oxide and titanium is by etching with a sulphuric acid-hydrofluoric acid solution.

References Cited

UNITED STATES PATENTS

| | | | |
|---|---|---|---|
| 3,287,612 | 11/1966 | Lepselter | 317—235 |
| 3,386,894 | 6/1968 | Steppat | 204—15 |
| 3,388,048 | 6/1968 | Szabo | 204—15 |

JOHN H. MACK, Primary Examiner

T. TUFARIELLO, Assistant Examiner